US 6,954,394 B2

(12) United States Patent
Knall et al.

(10) Patent No.: US 6,954,394 B2
(45) Date of Patent: Oct. 11, 2005

(54) INTEGRATED CIRCUIT AND METHOD FOR SELECTING A SET OF MEMORY-CELL-LAYER-DEPENDENT OR TEMPERATURE-DEPENDENT OPERATING CONDITIONS

(75) Inventors: N. Johan Knall, Sunnyvale, CA (US); Roy E. Scheuerlein, Cupertino, CA (US); James M. Cleeves, Redwood City, CA (US); Bendik Kleveland, Santa Clara, CA (US); Mark G. Johnson, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 316 days.

(21) Appl. No.: 10/307,270

(22) Filed: Nov. 27, 2002

(65) Prior Publication Data

US 2004/0100831 A1 May 27, 2004

(51) Int. Cl.⁷ .............................. G11C 7/04; G11C 5/06
(52) U.S. Cl. ........................................ 365/211; 365/63
(58) Field of Search .............................. 365/63, 230.03, 365/211

(56) References Cited

U.S. PATENT DOCUMENTS

| | | | |
|---|---|---|---|
| 3,851,316 A | 11/1974 | Kodama | |
| 4,592,027 A | 5/1986 | Masaki | |
| 4,646,266 A | 2/1987 | Ovshinsky et al. | |
| 4,646,269 A | 2/1987 | Wong et al. | |
| 4,698,788 A | 10/1987 | Flannagan et al. | |
| 4,744,061 A | 5/1988 | Takemae et al. | |
| 4,873,669 A | 10/1989 | Furutani et al. | |
| 5,107,139 A | 4/1992 | Houston et al. | |
| 5,149,199 A | 9/1992 | Kinoshita et al. | |
| 5,276,644 A | 1/1994 | Pascucci et al. | |

(Continued)

OTHER PUBLICATIONS

"A 14ns 1Mb CMOS SRAM with Variable Bit–Organization," Wada et al., 1988 IEEE International Solid–State Circuits Conference, pp. 252–253 (Feb. 19, 1988).

"Partial Selection of Passive Element Memory Cell Sub–Arrays for Write Operation," U.S. Appl. No. 09/748,649, filed Dec. 22, 2000; inventors: Roy E. Scheuerlein and Matthew P. Crowley.

"A CMOS Bandgap Reference Circuit with Sub–1V Operation," IEEE Journal of Solid–State Circuits, vol. 34, No. 5, May 1999, pp. 670–674.

"Sub–1V CMOS Proportional to Absolute Temperature References," IEEE Journal of Solid–State Circuits, vol. 38, No. 1, Jan. 2003, pp. 85–89.

"The flash memory read path: building blocks and critical aspects," Micheloni et al., Proceedings of the IEEE, vol. 91, No. 4, Apr. 2003, pp. 537–553.

(Continued)

Primary Examiner—Trong Phan
(74) Attorney, Agent, or Firm—Brinks Hofer Gilson & Lione

(57) ABSTRACT

The preferred embodiments described herein relate to an integrated circuit and method for selecting a set of memory-cell-layer-dependent or temperature-dependent operating conditions. In one preferred embodiment, a memory array is provided comprising a plurality of memory cells arranged in L layers stacked vertically above one another in a single integrated circuit. A memory cell layer in the memory array is selected, and one of N sets of memory-cell-layer-dependent writing conditions and/or one of K sets of memory-cell-layer-dependent reading conditions is selected based on the selected memory cell layer. In another preferred embodiment, a temperature of an integrated circuit is measured, and a set of writing conditions and/or a set of reading conditions is selected based on the measured temperature. Other preferred embodiments are provided, and each of the preferred embodiments can be used alone or in combination with one another.

41 Claims, 5 Drawing Sheets

U.S. PATENT DOCUMENTS

| | | | |
|---|---|---|---|
| 5,276,649 A | 1/1994 | Hoshita et al. | |
| 5,278,796 A | 1/1994 | Tillinghast et al. | |
| 5,359,571 A | 10/1994 | Yu | |
| 5,383,157 A | 1/1995 | Phelan | |
| 5,410,512 A | 4/1995 | Takase et al. | |
| 5,652,722 A | 7/1997 | Whitefield | |
| 5,784,328 A | 7/1998 | Irrinki et al. | |
| 5,818,748 A | 10/1998 | Bertin et al. | |
| 5,835,396 A | 11/1998 | Zhang | |
| 5,890,100 A | 3/1999 | Crayford | |
| 5,923,588 A | 7/1999 | Iwahashi | |
| 5,925,996 A | 7/1999 | Murray | |
| 5,940,340 A | 8/1999 | Ware et al. | |
| 5,961,215 A | 10/1999 | Lee et al. | |
| 5,977,746 A | 11/1999 | Hershberger et al. | |
| 6,034,882 A | 3/2000 | Johnson et al. | |
| 6,034,918 A | 3/2000 | Farmwald et al. | |
| 6,055,180 A | 4/2000 | Gudesen et al. | |
| 6,070,222 A | 5/2000 | Farmwald et al. | |
| 6,157,244 A | 12/2000 | Lee et al. | |
| 6,185,121 B1 | 2/2001 | O'Neill | |
| 6,185,712 B1 | 2/2001 | Kirihata et al. | |
| 6,205,074 B1 | 3/2001 | Van Buskirk et al. | |
| 6,208,545 B1 | 3/2001 | Leedy | |
| 6,212,121 B1 | 4/2001 | Ryu et al. | |
| 6,236,587 B1 | 5/2001 | Gudesen et al. | |
| 6,240,046 B1 | 5/2001 | Proebsting | |
| 6,246,610 B1 | 6/2001 | Han et al. | |
| 6,335,889 B1 | 1/2002 | Onodera | |
| 6,356,485 B1 | 3/2002 | Proebsting | |
| 6,373,768 B2 | 4/2002 | Woo et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,507,238 B1 | 1/2003 | Yang | |
| 6,525,953 B1 | 2/2003 | Johnson | |
| 6,560,152 B1 | 5/2003 | Cernea | |
| 6,577,549 B1 | 6/2003 | Tran et al. | |
| 6,724,665 B2 | 4/2004 | Scheuerlein et al. | |
| 6,754,124 B2 * | 6/2004 | Seyyedy et al. | 365/63 |
| 2002/0028541 A1 | 3/2002 | Lee et al. | |
| 2002/0136045 A1 | 9/2002 | Scheuerlein | |
| 2002/0136047 A1 | 9/2002 | Scheuerlein | |
| 2003/0043643 A1 | 3/2003 | Scheuerlein et al. | |
| 2003/0046020 A1 | 3/2003 | Scheuerlein | |

OTHER PUBLICATIONS

"A current–based reference–generations scheme for 1T–1C ferroelectric random–access memories," Siu et al., IEEE Journal of Solid–State Circuits, vol. 38 Issue 3, Mar. 2003, pp. 541–549.

"64M×8 Bit NAND Flash Memory," Samsung Electroncs (Oct. 27, 2000).

"How Flash Memory Works," wysiwyg://8/http://www.howstuffworks.com/flash–memory.htm?printable=1, 5 pages (1998).

"Datalight FlashFX™ 4.06 User's Guide," p. 11 (Aug. 2000).

"How Does TrueFFS® manage Wear Leveling?," http://www.m–sys.com/content/information/calcInfo.asp, 2 pages (printed Oct. 5, 2001).

* cited by examiner

Fig. 5
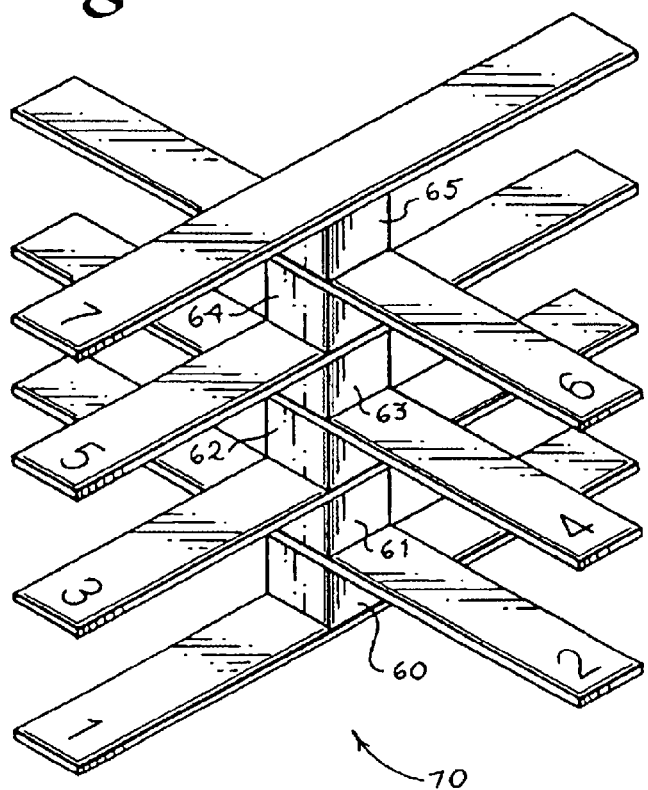
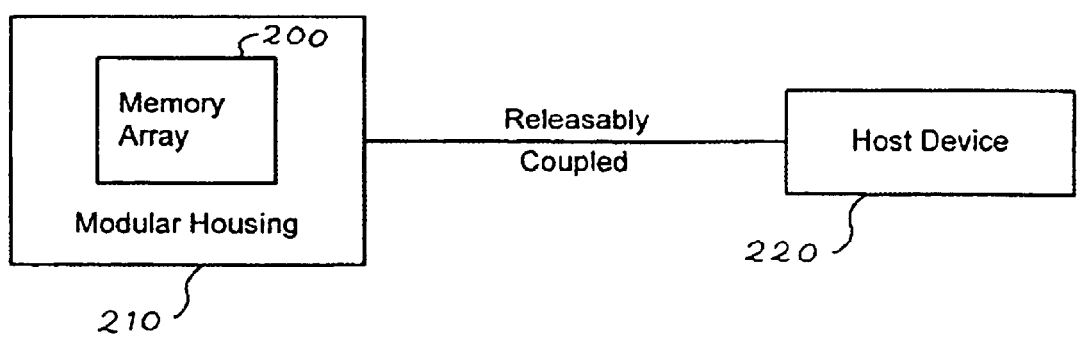
Fig. 6

INTEGRATED CIRCUIT AND METHOD FOR SELECTING A SET OF MEMORY-CELL-LAYER-DEPENDENT OR TEMPERATURE-DEPENDENT OPERATING CONDITIONS

BACKGROUND

Several three-dimensional integrated circuit memories utilize vertically-stacked layers of memory cells on a single integrated circuit. See, for example, U.S. Pat. Nos. 6,034,882 and 6,420,215 and U.S. patent application No. US2002/0028541, which are assigned to the assignee of the present invention. When the numerous layers of memory cells are sequentially fabricated onto an integrated circuit device using standard high-volume manufacturing processes, the resulting numerous layers of cells may not be perfectly identical. For example, there may be "random" differences (i.e., differences that fluctuate from device to device and from manufacturing lot to manufacturing lot) among the layers on a three-dimensional memory chip. Often, it is found that random differences among layers of the same chip are caused by normal, random fluctuations of the high-volume manufacturing process. "Systematic" differences (i.e., differences that are generally observed to occur on many or perhaps most of the manufactured units) may also appear among layers of the same chip. Systematic differences may arise due to different designs of the different layers, as, for example, in U.S. Pat. Nos. 6,034,882 and 6,420,215, where even-numbered layers have a unidirectional current-flow element in one orientation, while odd-numbered layers have a unidirectional current-flow element in an opposite orientation. Other causes of systematic differences among layers are possible. For example, systematic differences may be caused by different manufacturing machines used on different layers, differences between photomasks (e.g., slightly different linewidths) used to fabricate different layers, cumulative per-layer effects (e.g., total-time-at-temperature) leading to a gradient of differences between the sequentially-processed layers on a chip, and different layer-to-layer misalignments.

Random and/or systematic differences between layers of memory cells on the same integrated circuit can give rise to undesirable consequences. For example, different layers may have different "writing thresholds," meaning that for a certain individual unit, the optimum conditions for writing memory cells in layer A may be different than the optimum conditions for writing memory cells in layer B. Different layers of memory cells may operate slightly differently in read operations as well. That is, for a certain individual unit, the optimum conditions for reading memory cells in layer C may be different than the optimum conditions for reading memory cells in layer D. In a conventional design, the same writing and reading conditions are used for all memory cell layers. Due to random and/or systematic differences among memory cell layers, this rigid application of the same write and read conditions for all layers means that some layers are written and read at less than optimal conditions.

SUMMARY

The present invention is defined by the following claims, and nothing in this section should be taken as a limitation on those claims.

By way of introduction, the preferred embodiments described below provide an integrated circuit and method for selecting a set of memory-cell-layer-dependent or temperature-dependent operating conditions. In one preferred embodiment, a memory array is provided comprising a plurality of memory cells arranged in L layers stacked vertically above one another in a single integrated circuit. A memory cell layer in the memory array is selected, and one of N sets of memory-cell-layer-dependent writing conditions and/or one of K sets of memory-cell-layer-dependent reading conditions is selected based on the selected memory cell layer. In another preferred embodiment, a temperature of an integrated circuit is measured, and a set of writing conditions and/or a set of reading conditions is selected based on the measured temperature. Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 5 is an illustration of a memory array of a preferred embodiment in which a plurality of memory cells are arranged in L layers stacked vertically above one another in a single integrated circuit.

FIG. 6 is an illustration of a memory array of a preferred embodiment housed in a modular housing adapted to be releasably coupled to a host device.

DETAILED DESCRIPTION OF THE PRESENTLY PREFERRED EMBODIMENTS

Figure 1:
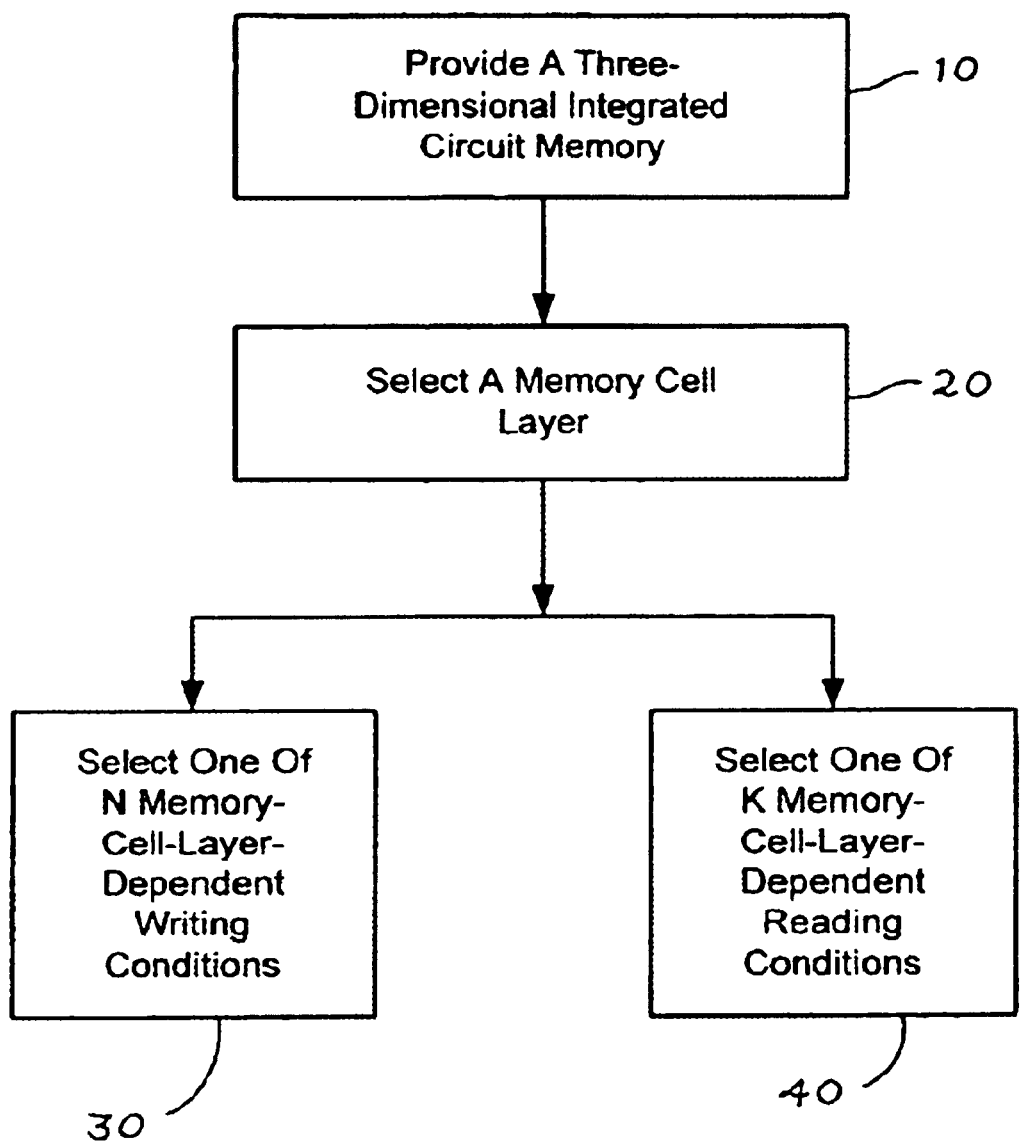
FIG. 1 is a flow chart of a method of a preferred embodiment for selecting a set of memory-cell-layer-dependent operating conditions.

Some of the preferred embodiments describe herein relate to a field-programmable, non-volatile, three-dimensional integrated circuit memory. As used herein, the term "three-dimensional integrated circuit memory" refers to a memory array comprising a plurality of memory cells arranged in L layers stacked vertically above one another in a single integrated circuit, wherein L>1. U.S. Pat. Nos. 6,034,882 and 6,420,215 and U.S. patent application No. US2002/0028541, which are assigned to the assignee of the present application and are hereby incorporated by reference, provide further details on a preferred three-dimensional integrated circuit memory. FIG. 5 is an illustration of one of the many implementations of a three-dimensional integrated circuit memory disclosed in those patent documents. FIG. 5 shows a plurality of memory cells 60, 61, 62, 63, 64, 65 arranged in L layers (here, L=6) stacked vertically above one another in a single integrated circuit 70 (elements 1–7 are conductor layers). It should be noted that some prior memory arrays have memory cells that protrude either upwardly or downwardly. While these cells have, in the past, been referred to as "three dimensional memory cells," these memory cells are arrayed in a conventional two-dimensional array and are not arranged in layers that are stacked vertically above one another. Accordingly, an array of such cells is not a "three-dimensional integrated circuit memory," as that term is used herein. Further, individual integrated circuits each containing a two-dimensional memory array can be stacked and secured together to form a multi-chip assembly. However, a multi-chip assembly is merely a stack of finished, conventional, non-layered memory chips and is different from a three-dimensional integrated circuit memory, which has a number of layers of memory cells stacked on top of each other on a single integrated circuit chip.

Three-dimensional integrated circuit memories can be used in any suitable device. For example, a three-dimensional integrated circuit memory 200 can be part of a modular memory device (such as a memory card or stick) 210 that is removably connectable to a host device 220 having a mating connection (see FIG. 6). The host device comprises a processing unit that reads data from/writes data to the three-dimensional integrated circuit memory. The host device can be, for example, a portable consumer electronic device such as a cell phone, a music player, a personal digital assistant, or a digital camera. Instead of being removable from a host device, the three-dimensional integrated circuit memory can be part of a device that comprises a processing unit. For example, the integrated circuit can be a permanent part of a cell phone. While the memory cells of the three-dimensional integrated circuit memory are preferably made from a semiconductor material, other materials, such as phase-change materials and amorphous solids as well as those used with MRAM and organic passive element arrays, can be used.

As described in the background section, random and/or systematic differences between layers of memory cells can result in different optimum reading and writing conditions for different memory cell layers. Accordingly, applying the same reading and writing conditions to all layers can result in reading and writing the memory cell layers using less-than-optimal operating conditions. This preferred embodiment overcomes that problem by providing a plurality of different write conditions and/or a plurality of different read conditions that are selectively applied to different layers of memory cells.

Turning now to the drawings, FIG. 1 is a flow chart of a method of a preferred embodiment for selecting a set of memory-cell-layer-dependent operating conditions. As shown in FIG. 1, a three-dimensional integrated circuit memory is provided with L layers of memory cells (act 10). In this illustration, the three-dimensional integrated circuit memory contains eight different memory layers vertically stacked on a single integrated circuit chip (i.e., L=8). Conventional design practice would provide one possible writing condition and one possible reading condition and uniformly apply those conditions to all L memory layers. In contrast, this preferred embodiment provides N different possible writing conditions (N>1) and K different possible reading conditions (K>1) and selectively applies different ones of those writing and reading conditions to different memory layers. In operation, a memory cell layer in the memory array is selected (act 20). If a write operation is being performed, one of N sets of memory-cell-layer-dependent writing conditions is selected based on the selected layer (act 30). If a read operation is being performed, one of K sets of memory-cell-layer-dependent reading conditions is selected based on the selected layer (act 40). The selected writing or reading condition is then applied to the selected memory cell level As used herein, the term "writing condition" broadly refers to a set of bias voltages, bias currents, and/or timing pulses that are applied to a memory cell during a write operation. A "set" refers to a group having one or more than one member. Examples of writing conditions include, but are not limited to, voltage of a selected wordline during a write, voltage of an un-selected wordline during a write, voltage of a selected bitline when writing a "zero," voltage of a selected bitline when writing a "one," voltage of an un-selected bitline during a write, width of a precharge pulse, width of a write pulse, current sourced into a selected wordline during a write, current sourced into an un-selected wordline during a write, current sourced into a selected bitline when writing a "zero," current sourced into a selected bitline when writing a "one," and current sourced into an un-selected bitline during a write. Similarly, the term "reading condition" broadly refers to a set of bias voltages, bias currents, and/or timing pulses that are applied to a memory cell during a read operation. Examples of reading conditions include, but are not limited to, voltage of a selected wordline during a read, voltage of an un-selected wordline during a read, voltage of a selected bitline when reading a "zero," voltage of a selected bitline when reading a "one," voltage of an un-selected bitline during a read, width of a precharge pulse, width of a read pulse, current sourced into a selected wordline during a read, current sourced into an un-selected wordline during a read, current sourced into a selected bitline when reading a "zero," current sourced into a selected bitline when reading a "one," and current sourced into an un-selected bitline during a read. As described in more detail below, preferably, the set of voltages, currents, and/or timing pulses used in the writing and reading conditions is controlled by the designer of the integrated circuit and can be changed by the designer, if desired.

In the embodiments described above, there are both a plurality of different writing conditions (N>1) and a plurality of different reading conditions (K>1) that are selectively applied to different memory cell layers. It should be noted that a plurality of different writing conditions (N>1) can be used with a single set of reading conditions (K=1), or a plurality of different reading conditions (K>1) can be used with a single set of writing conditions (N=1). Accorindgly, the following three situations are possible: (1) N>1 while K=1; (2) N=1 while K>1; and (3) N>1 while K>1. (N=1 while K=1 describes conventional design practice, which applies a single set of writing conditions and a single set of reading conditions uniformly to all L memory layers.) It should also be noted that the sets of writing conditions and reading conditions can be equal to or less than the number of memory cell layers. Consider, for example, a memory array with eight layers of memory cells (L=8). If N=2, there would be two different possible writing conditions. Some of the eight memory cell layers would get one writing condition, and the remainder of the eight memory cell layers would get the other writing condition. If N=L, there would be L different possible writing conditions, and each one of the L different memory cell layers would get its own individual writing condition. The same situation applies for reading conditions. That is, if there are two different possible reading conditions (K=2), some of the L memory cell layers would get one reading condition, and the rest of the L memory cell layers would get the other reading condition. If K=L, each one of the L different memory cell layers would get its own reading condition. Further, while the example above has N=K=2, N and K can have values other than 2. Additionally, while the number of different writing conditions can be the same as the number of different reading conditions (N=K), different numbers of writing and reading conditions can be used (N≠K). That is, the number of memory-cell-layer-dependent sets of write conditions can be different from the number of memory-cell-layer-dependent sets of read conditions.

Figure 2:
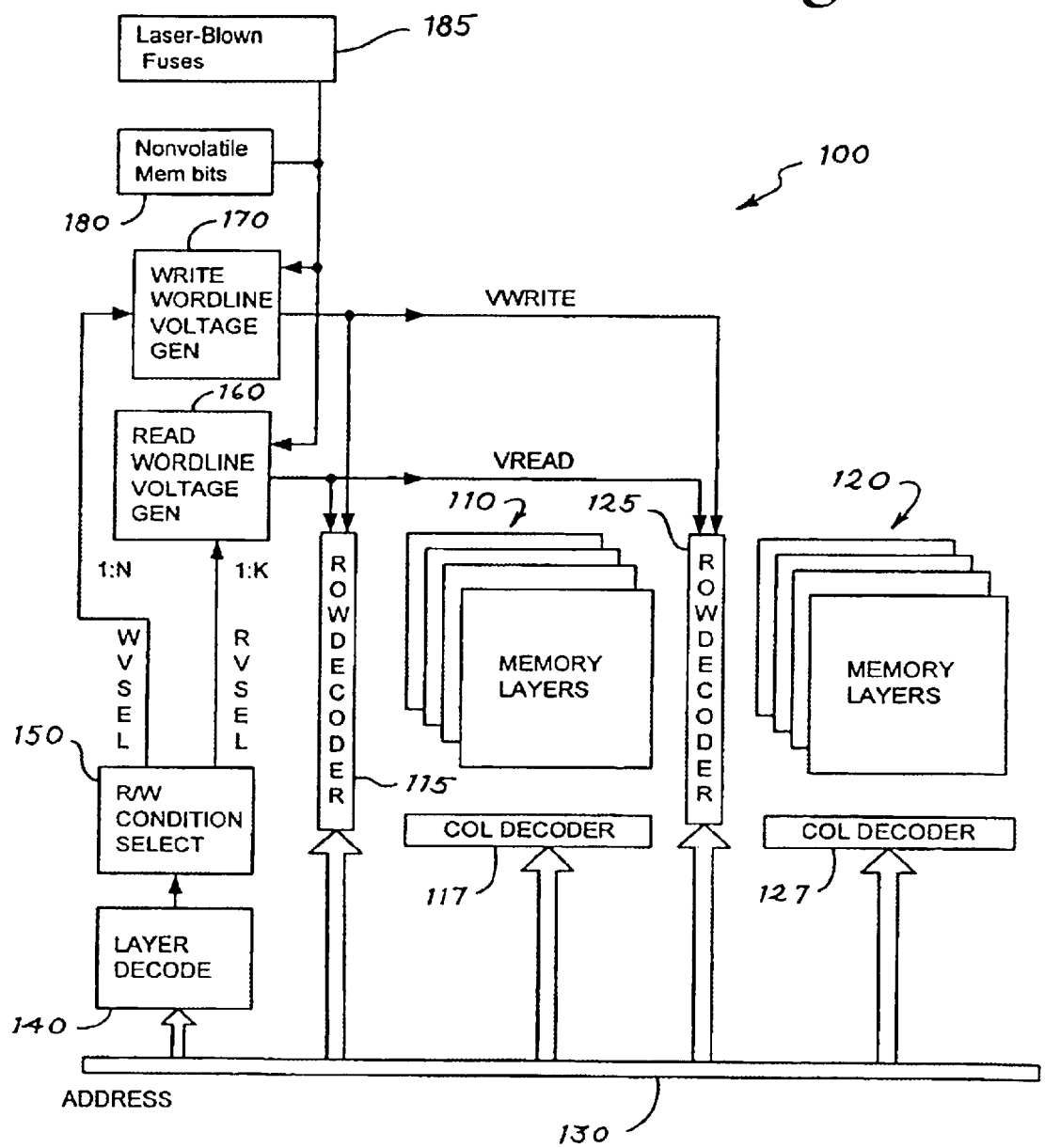
FIG. 2 is a block diagram of an integrated circuit of a preferred embodiment.

Turning again to the drawings, FIG. 2 is a block diagram of an integrated circuit 100 that will be used to illustrate an implementation in which write conditions are optimized by setting the voltage of the selected wordline during write, and the read conditions are optimized by setting the voltage of the selected wordline during read. Of course, other implementations can use different or additional write and read conditions. In this implementation, there are two different optimized wordline voltage settings during write (N=2) and two different optimized wordline voltage settings during read (K=2). The integrated circuit 100 comprises a three-dimensional integrated circuit memory, which, in this embodiment, is divided into a plurality of smaller arrays, or "sub-arrays." A sub-array is a contiguous group of memory cells having contiguous word and bit lines generally unbroken by decoders, drivers, sense amplifiers, and input/output circuits. Among other benefits, dividing a memory into sub-arrays results in faster programming of the memory cells in the array. In this embodiment, each sub-array comprises 1024 rows and 1024 columns on each of 8 planes, forming a 1024×1024×8 memory plane array. While FIG. 2 shows only two sub-arrays 110, 120 to simplify the drawing, the memory array can be divided into more than two sub-arrays. Further, the embodiments presented herein can operate with a memory array that is not divided into multiple sub-arrays. For ease of description, the term "array" may be used synonymously with the term "sub-array."

FIG. 2 also shows some of the support circuitry used with the memory array. (Data paths and other control circuits are not illustrated to simplify the drawing.) The integrated circuit 100 comprises row decoders 115, 125 and column decoders 117, 127 for each of the sub-arrays 110, 120, a layer decoder 140, a read/write condition selector 150, a read word line voltage generator 160, a write word line voltage generator 170, and nonvolatile memory 180. An address bus 130 provides addresses to the row decoders 115, 125 and column decoders 117, 127 and also to the layer decoder 140. The row decoders 115, 125 and column decoders 117, 127 decode the addresses and generate the appropriate select lines to the sub-arrays 110, 120. The layer decoder 140 calculates the memory cell layer number from the addresses. When a memory cell is addressed, it is straightforward to calculate the cell's layer number. This calculation (the "decoding") is very simple and can easily be accomplished with simple Boolean logic gates. In some cases, no active logic circuitry is required, and a memory layer can be selected merely by selecting the appropriate set of address wire(s).

The layer decoder 140 sends the calculated memory cell layer number to a read/write condition selector 150, which decides which one of the N sets of write conditions and K sets of read conditions to use for the selected layer. The chosen write conditions (in this implementation, the wordline voltage during a write) are sent to the write wordline voltage generator 170 on a signal bus named WVSEL, and the chosen read conditions (in this implementation, the wordline voltage during a read) are sent to the read wordline voltage generator 160 on a signal bus named RVSEL. The write wordline voltage generator 170 outputs the selected write condition on a signal bus named VWRITE, and the read wordline voltage generator 160 outputs the selected read condition on a signal bus named VREAD. These signals are routed to the memory sub-arrays 110, 120 where they control the appropriate circuitry to affect write conditions and read conditions. In this preferred embodiment, the write conditions and the read conditions are controlled via the row decoders 115, 125, and bits of nonvolatile memory 180 are used to control the voltages produced by the write wordline voltage generator 170 and the read wordline voltage generator 160.

It should be noted that many variations to the implementation shown in FIG. 2 are possible. For example, an integrated circuit can include N different and distinct write wordline voltage generators, and the output WVSEL of the read/write condition selector can control a multiplexor that selects only one of these N generators and connects it onto the VWRITE signal. The multiplexing can occur inside the row decoders themselves. Other alternate embodiments can have the read/write condition selector control circuitry related to bitlines, for example, the bias voltage of selected bitlines during a write-zero operation. These alternate embodiments can contain circuit blocks other than those depicted in FIG. 2 (e.g., write bitline voltage generators and/or read bitline voltage current sinks, etc). Those additional blocks can route the read/write condition selector outputs to the column decoders or to the write drivers and sense amps, etc. In yet another alternate embodiment, the read/write condition selector can control one or more timing generators, such as pre-charge pulse generators, write pulse generators, and so forth. (It should be noted that although these timing generators are not depicted on FIG. 2, they are mentioned above in the lists of possible controlled elements.)

Figure 3:
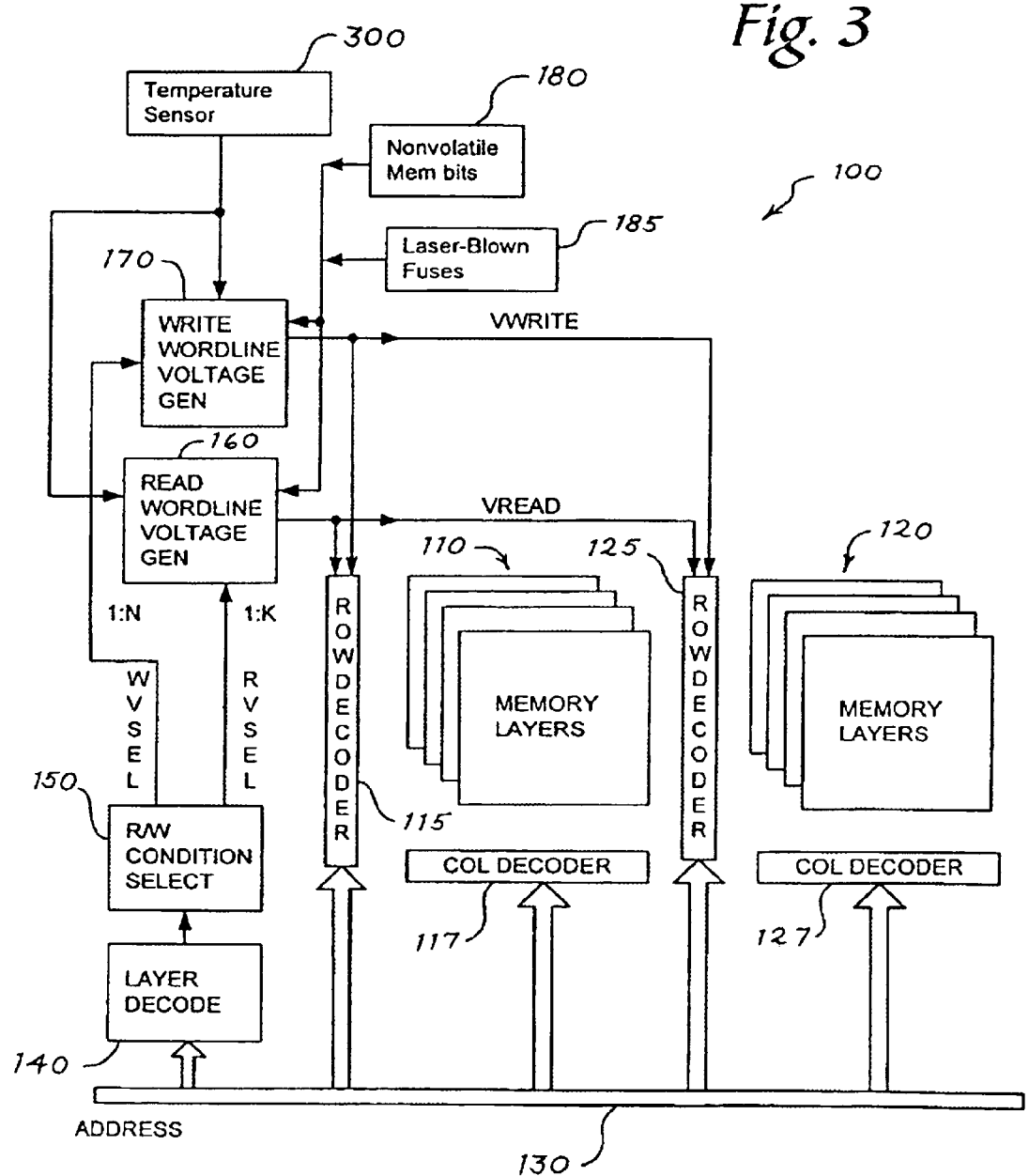
FIG. 3 is a block diagram of an integrated circuit with a temperature sensor of a preferred embodiment.
Figure 4:
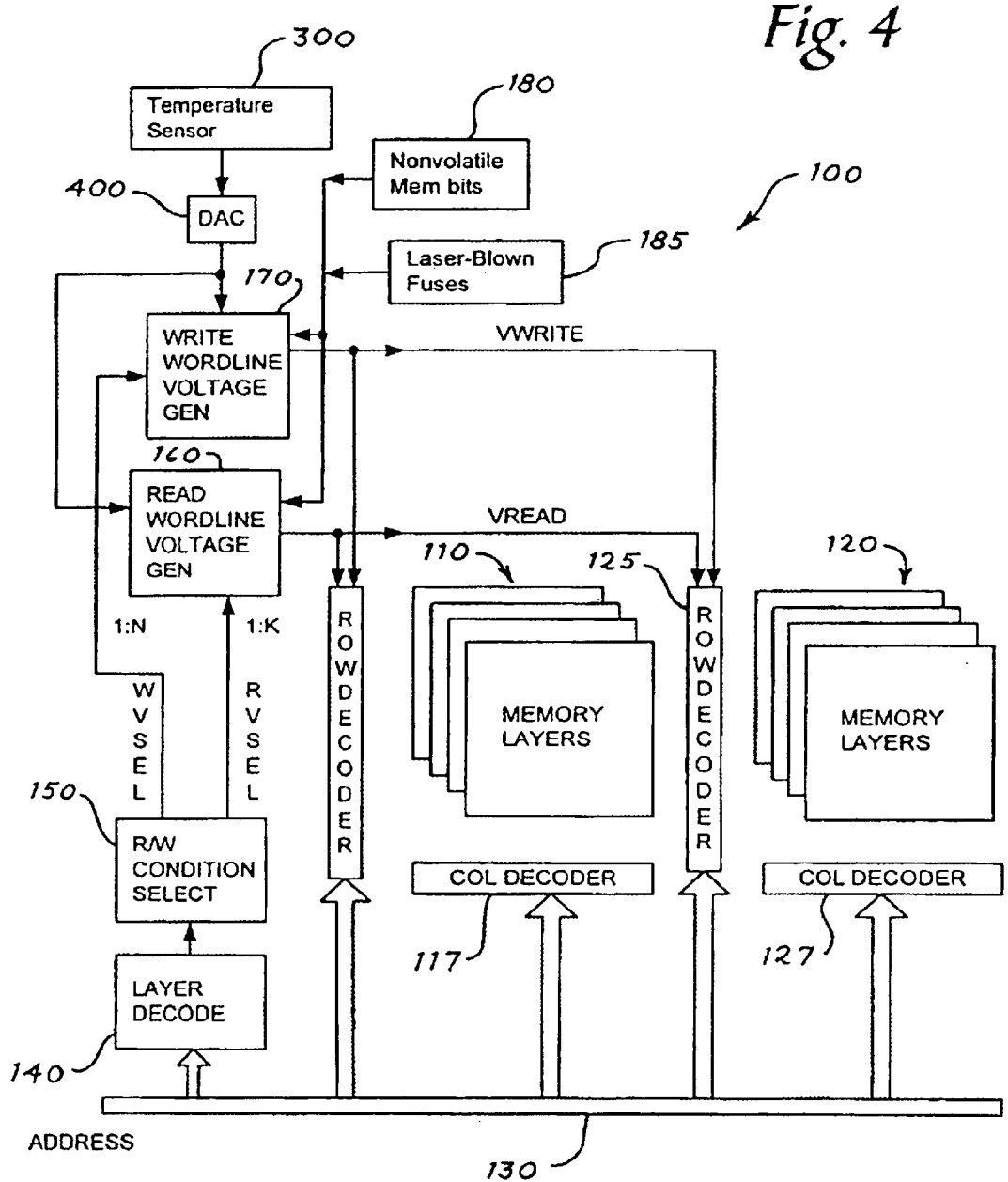
FIG. 4 is a block diagram of an integrated circuit with a temperature sensor and a digital-to-analog converter of a preferred embodiment.

In another alternate embodiment, measured temperature is used to vary or select a set of writing and/or reading conditions. It has been observed that write operations to three-dimensional integrated circuit memories have a temperature dependence. For example, antifuse-based memory cells rupture at lower voltages when the write operation occurs at a relatively high temperature and rupture at higher voltages when the write operation occurs at a relatively low temperature. An alternate embodiment compensates for this temperature effect so that cells are written at a sufficiently high voltage to program them reliably, but not higher. As shown in FIG. 3, the integrated circuit 100 can include a temperature sensor circuit 300, such as the one taught in U.S. Pat. No. 6,157,244, which is hereby incorporated by reference. The temperature sensor circuit 300 measures the junction temperature of the chip and provides an output that may then be used to vary the writing conditions of the memory by adjusting the write wordline voltage generator 170. Additionally or alternatively, the output of the temperature sensor circuit 300 can be used to vary the reading conditions of the memory by adjusting the read wordline voltage generator 160. In another embodiment, a digital-to-analog converter ("DAC") 400 is interposed between the temperature sensor circuit 300 and the write wordline voltage generator 170 (see FIG. 4). It should be noted that varying writing and/or reading conditions based on temperature can be applied both to three-dimensional integrated circuit memories and other types of memory arrays (e.g., conventional two-dimensional memory arrays). Additionally, the selection of the writing and/or reading conditions can be based on measured temperature alone (i.e., the selection of the writing and/or reading conditions can be temperature dependent but memory cell layer independent) or in conjunction with the selected memory cell layer (i.e., the selection of the writing and/or reading conditions can be both temperature and memory cell layer dependent).

As described above, in this preferred embodiment, there are N sets of writing conditions and K sets of reading conditions, where either (N>1) or (K>1) or both. The different writing conditions and/or reading conditions can be chosen in several different ways. For example, if it is known in advance that a systematic difference among the various layers will exist, then the memory chip designer can provide, in advance, sets of optimum read conditions and optimum write conditions for the anticipated systematic differences. For example, it may be known in advance that layers 0, 2, 4, and 6 are expected to resemble each other quite closely and that layers 1, 3, 5, and 7 are expected to resemble each other quite closely, but it is further expected that layers 0, 2, 4, and 6 will be different than layers 1, 3, 5, and 7. In this case, the designer can supply N=2 sets of writing conditions (one set of conditions for layers 0, 2, 4, and 6 and the other set of conditions for layers 1, 3, 5, and 7), and the designer can supply K=2 sets of reading conditions (one set for layers 0, 2, 4, and 6 and the other set for layers 1, 3, 5, and 7). For example, it can be known in advance that layers 0, 2, 4, and 6 should be written with a wordline voltage of $V_1$ volts, while layers 1, 3, 5, and 7 should be written with a wordline voltage of $V_2$ volts. It can also be known in advance that that layers 0, 2, 4, and 6 should be read using a sense current of $I_3$ nanoamps, while layers 1, 3, 5, and 7 should be read using a sense current of $I_4$ nanoamps. These sets of conditions can be specified in the design, and, during operation, the memory can select one set of conditions based upon the decoded layer number of the current address.

It is also possible that the precise values of the optimum write conditions and the optimum read conditions may not be known during design. The optimum conditions may, for example, vary randomly from chip to chip. In this case, specific values of the optimized conditions for each individual chip may be determined by making specialized measurements during manufacturing testing. Once the optimum conditions for a chip have been measured, they can be programmed into the chip using laser-blown fuses, nonvolatile memory bits, or other methods widely known by those skilled in the art. In this case, the designer may decide to allow two sets of operating conditions (i.e., N=2, K=2), or the designer may decide to allow a larger number of sets, up to and including L different sets of operating conditions (i.e., one set of conditions for each of the L layers of memory cells on the chip). By measuring the optimum write and read conditions for each memory cell layer of each manufactured memory chip, each manufactured memory chip can have its write conditions and/or read conditions optimized individually, thereby ameliorating the effects of random process variations.

One way to make the specialized measurements that determine, layer by layer, the optimum write conditions and the optimum read conditions for each individual memory chip is to deliberately add testing features and/or test circuitry to the memory which simplify the measurements. Providing additional rows and columns of memory cells is one way to enable the measurement of optimum write conditions and optimum read conditions. U.S. Pat. No. 6,407,953, which is assigned to the assignee of the present application and is hereby incorporated by reference, describes such a technique. (In the implementation shown in FIG. 2, the optimized voltages were determined by measuring each individual chip during manufacturing testing rather than by design calculations before manufacturing. The manufacturing tester programs the measured optimum settings into nonvolatile memory 180 on the chip.)

As taught in U.S. Pat. No. 6,407,953, extra columns (bitlines) called "test columns" can be added at the left-hand end and the right-hand end of the rows (wordlines), and extra rows (wordlines) called "test rows" can be added at the top end and the bottom end of the columns (bitlines). In this embodiment, the test columns at the ends of the wordlines and the test rows at the ends of the bitlines are programmed during testing, layer by layer, to determine the optimum write conditions for each layer. The test rows and test columns are read during testing, layer by layer, to determine the optimum read conditions for each layer. The most difficult cells to program along a given wordline or bitline are the ones on the ends. Accordingly, it is preferred that the test columns be located at both ends of the wordlines so that testing and measurement can take place on the most difficult to program cells along the wordlines. Similarly, it is preferred that the test rows be located at both ends of the bitlines so that testing and measurement can take place on the most difficult to program cells along the bitlines.

In another preferred embodiment, a measurement is performed during testing in which a subset of the bits in the test columns and test rows are programmed using a set of writing conditions. The speed of this write operation is measured. Then, another set of writing conditions is applied, and another subset of the bits in the test columns and test rows are programmed. The speed of this new write operation is measured. The procedure is repeated, measuring writing speed at various programming conditions. It is now possible to select an optimum set of writing conditions based upon write bandwidth or writing speed. This embodiment is preferred because it ensures that the bits are not only programmed correctly but also in a sufficiently short time period. In yet another embodiment, the current sourced into a selected bitline is measured when reading a zero, and the current sourced into a selected bitline is measured when reading a one in order to find the optimum set of read conditions. The voltage of a selected wordline during reads is modified, and the read current is measured when reading a one and when reading a zero. These measurements make it possible to optimize the margin of safety between reading a zero and reading a one.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for selecting a set of memory-cell-layer-dependent operating conditions, the method comprising:
   (a) providing a memory array comprising a plurality of memory cells arranged in L layers stacked vertically above one another in a single integrated circuit, wherein L>1;
   (b) selecting a memory cell layer; and
   (c) performing at least one of the following:
      (c1) selecting one of N sets of memory-cell-layer-dependent writing conditions based on the selected memory cell layer, wherein N>1, and applying the selected set of memory-cell-layer-dependent writing conditions to the selected memory cell layer; and
      (c2) selecting one of K sets of memory-cell-layer-dependent reading conditions based on the selected memory cell layer, wherein K>1, and applying the selected set of memory-cell-layer-dependent reading conditions to the selected memory cell layer.

2. The invention of claim 1, wherein (c1) is performed, and wherein the invention further comprises applying a different set of writing conditions to at least one other memory cell level.

3. The invention of claim 1, wherein (c2) is performed, and wherein the invention further comprises applying a different set of reading conditions to at least one other memory cell level.

4. The invention of claim 1 further comprising:
(d) measuring a temperature of the integrated circuit; and
(e) performing at least one of the following:
  (e1) varying the set of writing conditions selected in (c1) based on the measured temperature of the integrated circuit; and
  (e2) varying the set of reading conditions selected in (c2) based on the measured temperature of the integrated circuit.

5. The invention of claim 1, wherein (c1) but not (c2) is performed and a single set of reading conditions is applied to each memory cell layer in the memory array.

6. The invention of claim 1, wherein (c2) but not (c1) is performed and a single set of writing conditions is applied to each memory cell layer in the memory array.

7. The invention of claim 1, wherein both (c1) and (c2) are performed.

8. The invention of claim 1, wherein N=2.

9. The invention of claim 1, wherein N=L.

10. The invention of claim 1, wherein L>N>2.

11. The invention of claim 1, wherein K=2.

12. The invention of claim 1, wherein K=L.

13. The invention of claim 1, wherein L>K>2.

14. The invention of claim 1, wherein N=K.

15. The invention of claim 1, wherein N≠K.

16. The invention of claim 1, wherein the N sets of memory-cell-layer-dependent writing conditions are identical to the K sets of memory-cell-layer-dependent reading conditions.

17. The invention of claim 1, wherein the N sets of memory-cell-layer-dependent writing conditions are different from the K sets of memory-cell-layer-dependent reading conditions.

18. The invention of claim 1, wherein at least one of the N sets of memory-cell-layer-dependent writing conditions and the K sets of memory-cell-layer-dependent reading conditions is stored in a set of laser-blown fuses.

19. The invention of claim 1, wherein at least one of the N sets of memory-cell-layer-dependent writing conditions and the K sets of memory-cell-layer-dependent reading conditions is stored in a set of non-volatile memory cells.

20. The invention of claim 1, wherein at least one of the N sets of memory-cell-layer-dependent writing conditions and the K sets of memory-cell-layer-dependent reading conditions is determined before manufacturing the memory array.

21. The invention of claim 1, wherein at least one of the N sets of memory-cell-layer-dependent writing conditions and the K sets of memory-cell-layer-dependent reading conditions is determined during manufacturing testing of the memory array.

22. The invention of claim 1, wherein the set of memory-cell-layer-dependent writing conditions comprises a voltage of a selected wordline during a write operation.

23. The invention of claim 1, wherein the set of memory-cell-layer-dependent reading conditions comprises a voltage of a selected wordline during a read operation.

24. The invention of claim 1, wherein the set of memory-cell-layer-dependent writing conditions is defined by using current in deselected bitlines.

25. The invention of claim 1, wherein the plurality of memory cells comprise write-once memory cells.

26. The invention of claim 1, wherein the memory array is housed in a modular housing adapted to be releasably coupled to a host device.

27. An integrated circuit comprising:
a memory array comprising a plurality of memory cells arranged in L layers stacked vertically above one another in a single integrated circuit, wherein L>1; and
circuitry operative to select a memory cell layer and perform at least one of the following:
  select one of N sets of memory-cell-layer-dependent writing conditions based on the selected memory cell layer, wherein N>1, and apply the selected set of memory-cell-layer-dependent writing conditions to the selected memory cell layer; and
  select one of K sets of memory-cell-layer-dependent reading conditions based on the selected memory cell layer, wherein K>1, and apply the selected set of memory-cell-layer-dependent reading conditions to the selected memory cell layer.

28. The invention of claim 27 further comprising:
a temperature sensor; and
circuitry operative to perform at least one of the following:
  vary a set of selected writing conditions based on a temperature of the integrated circuit measured by the temperature sensor; and
  vary a set of selected reading conditions based on a temperature of the integrated circuit measured by the temperature sensor.

29. A method for selecting a set of temperature-dependent operating conditions, the method comprising:
(a) providing an integrated circuit comprising a memory array comprising a plurality of memory cells;
(b) measuring a temperature of the integrated circuit; and
(c) performing at least one of the following:
  (c1) selecting a set of writing conditions based on the measured temperature and applying the selected set of writing conditions; and
  (c2) selecting a set of reading conditions based on the measured temperature and applying the selected set of reading conditions.

30. The invention of claim 29, wherein memory array comprises a two-dimensional array.

31. The invention of claim 29, wherein the plurality of memory cells are arranged in a plurality of layers stacked vertically above one another in a single integrated circuit.

32. The invention of claim 31, wherein the selection of the set of writing conditions in (c1) is also based on which memory cell layer is selected in the memory array.

33. The invention of claim 31, wherein the selection of the set of writing conditions in (c1) is independent of which memory cell layer is selected in the memory array.

34. The invention of claim 31, wherein the selection of the set of reading conditions in (c2) is also based on which memory cell layer is selected in the memory array.

35. The invention of claim 31, wherein the selection of the set of reading conditions in (c2) is independent of which memory cell layer is selected in the memory array.

36. The invention of claim 31, wherein (c1) comprises applying the selected set of writing conditions to each of the memory cell layers in the memory array.

37. The invention of claim 31, wherein (c2) comprises applying the selected set of reading conditions to each of the memory cell layers in the memory array.

38. The invention of claim 29, wherein the set of writing conditions comprises a voltage of a selected wordline during a write operation.

39. The invention of claim 29, wherein the set of reading conditions comprises a voltage of a selected wordline during a read operation.

40. The invention of claim 29, wherein the plurality of memory cells comprise write-once memory cells.

41. The invention of claim 29, wherein the memory array is housed in a modular housing adapted to be releasably coupled to a host device.

* * * * *